United States Patent
Zhang

(10) Patent No.: US 10,140,901 B2
(45) Date of Patent: Nov. 27, 2018

(54) SHIFT REGISTER CIRCUIT, DISPLAY PANEL AND DISPLAY APPARATUS HAVING THE SAME

(71) Applicant: BOE TECHNOLOGY GROUP CO., LTD., Beijing (CN)

(72) Inventor: Yuting Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 39 days.

(21) Appl. No.: 15/520,557

(22) PCT Filed: Nov. 2, 2016

(86) PCT No.: PCT/CN2016/104341
§ 371 (c)(1),
(2) Date: Apr. 20, 2017

(87) PCT Pub. No.: WO2017/173818
PCT Pub. Date: Oct. 12, 2017

(65) Prior Publication Data
US 2018/0197448 A1     Jul. 12, 2018

(30) Foreign Application Priority Data
Apr. 8, 2016    (CN) .......................... 2016 1 0219065

(51) Int. Cl.
*G09G 3/20*       (2006.01)
*G11C 19/28*      (2006.01)

(52) U.S. Cl.
CPC ............... *G09G 3/20* (2013.01); *G11C 19/28* (2013.01); *G09G 2300/0408* (2013.01); *G09G 2310/0286* (2013.01)

(58) Field of Classification Search
CPC ............. G09G 3/20; G09G 2300/0408; G09G 2310/0286; G11C 19/28
See application file for complete search history.

(56) References Cited

U.S. PATENT DOCUMENTS

| 2007/0104307 | A1  | 5/2007 | Kim et al. |
| 2012/0139883 | A1* | 6/2012 | Lee ...................... G09G 3/3611 345/204 |
| 2014/0240209 | A1* | 8/2014 | Zhang .................. G09G 3/3648 345/92 |

FOREIGN PATENT DOCUMENTS

| CN | 202443728 U | 9/2012 |
| CN | 102867543 A | 1/2013 |

(Continued)

OTHER PUBLICATIONS

International Search Report & Written Opinion dated Jan. 22, 2017, regarding PCT/CN2016/104341.

*Primary Examiner* — Amit Chatly
(74) *Attorney, Agent, or Firm* — Intellectual Valley Law, P.C.

(57) ABSTRACT

The present application discloses a shift register circuit having a pull-down drive sub-unit providing a first pull-down signal to a pull-down node; a first pull-down sub-unit connected to the pull-down node, a pull-up node, and an output port, the first pull-down sub-unit being configured to reduce noise level at the pull-up node and/or the output port based on the first pull-down signal; and at least one second pull-down sub-unit, each of the at least one second pull-down sub-unit having a pull-down input port, each of the at least one second pull-down sub-unit connected to the pull-up node and the output port, and being configured to reduce noise level at the pull-up node and/or output port based on the second pull-down signal inputted into the pull-down input port.

18 Claims, 8 Drawing Sheets

(56) References Cited

FOREIGN PATENT DOCUMENTS

| | | |
|---|---|---|
| CN | 104616618 A | 5/2015 |
| CN | 105405387 A | 3/2016 |
| CN | 205582492 U | 9/2016 |
| KR | 100769970 B1 | 10/2007 |

* cited by examiner

SHIFT REGISTER CIRCUIT, DISPLAY PANEL AND DISPLAY APPARATUS HAVING THE SAME

CROSS-REFERENCE TO RELATED APPLICATION

This application is a national stage application under 35 U.S.C. § 371 of International Application No. PCT/CN2016/104341, filed Nov. 2, 2016, which claims priority to Chinese Patent Application No. 201610219065.4, filed Apr. 8, 2016, the contents of which are incorporated by reference in the entirety.

TECHNICAL FIELD

The present invention relates to display technology, more particularly, to a shift register circuit, and a display panel and a display apparatus having the same.

BACKGROUND

An integrated gate-driven shift register circuit is formed by cascading a plurality of shift register units to output gate driving pulse signals for controlling image display. As the integration is achieved on an array substrate, by obviating separate integrated circuits, substantial cost reduction may be achieved. Numerous embodiments may be practiced to make the shift register unit having various numbers of transistors (T) and capacitors (C). For example, the shift register unit may include 12T1C, 9T1C, or 13T1C circuitries. The gate driving pulse signal is generated at least by using a set of clock signals, a pull-up transistor, a pull-down transistor, and an output transistor in each shift register unit.

SUMMARY

In one aspect, the present disclosure provides a shift register circuit comprising a plurality of shift register units, each shift register unit being configured to provide a scan signal to a corresponding row of pixels of a display panel, the shift register unit comprises a pull-down drive sub-unit providing a first pull-down signal to a pull-down node; a first pull-down sub-unit connected to the pull-down node, a pull-up node, and an output port, the first pull-down sub-unit being configured to reduce noise level at the pull-up node and/or the output port based on the first pull-down signal; and at least one second pull-down sub-unit, each of the at least one second pull-down sub-unit having a pull-down input port, each of the at least one second pull-down sub-unit connected to the pull-up node and the output port, and being configured to reduce noise level at the pull-up node and/or output port based on the second pull-down signal inputted into the pull-down input port; wherein a sum of a first duty cycle of the first pull-down signal and a second duty cycle of the second pull-down signal is substantially 100%, the first pull-down signal and the second pull-down signal are inverted in phase.

Optionally, the shift register unit further comprises a pull-up drive sub-unit connected to a first input port and the pull-up node, and configured to pull up a potential level at the pull-up node based on a first input signal from the first input port; a first discharge sub-unit connected to the first input port, a second input port, the pull-up node, and the pull-down node, and configured to control discharging of the pull-down node based on the first input signal, a second input signal from the second input port, and/or the potential level at the pull-up node; and a second discharge sub-unit connected to the pull-up node and the pull-down input port, and configured to control discharging of the pull-down input port based on the potential level at the pull-up node.

Optionally, the shift register unit further comprises an output sub-unit connected to the pull-up node, the second input port, and the output port, and configured to control passing of a signal from the second input port to the output port.

Optionally, the shift register unit further comprises a third input port connected to the pull-down drive sub-unit, and configured to output a first pull-down signal to the pull-down node controlled by the pull-down drive sub-unit; wherein the plurality of shift register units are cascaded in multiple stages so that the output port of a current-stage unit is connected to the first input port of a next-stage unit, the pull-down input port of the current-stage unit is connected to the pull-down node of the next-stage unit.

Optionally, a third input signal inputted to the third input port and the second input signal inputted to the second input port are inverted in phase, each of the third input signal and the second input signal having a duty cycle of approximately 50%.

Optionally, the first pull-down sub-unit comprises a first transistor having a gate connected to the pull-down node, a source connected to the output port, and a drain connected to a first low-voltage port provided with a low voltage level, wherein the first transistor is controlled by the first pull-down signal to be in a conduction state for setting the output port to a low voltage level provided at the first low-voltage port; and a second transistor having a gate connected to the pull-down node, a source connected to the pull-up node, and a drain connected to a second low-voltage port provided with a low voltage level, wherein the second transistor is controlled by the first pull-down signal to be in a conduction state for setting the pull-up node to a low voltage level provided at the second low-voltage port.

Optionally, each of the first and the second transistors is configured to be operated in a forward-bias state for no more than 50% of a scan operation cycle of the shift register unit thereof.

Optionally, the second pull-down sub-unit comprises a third transistor having a gate connected to the pull-down signal input port, a source connected to the output port, and a drain connected to the first low-voltage port, wherein the third transistor is controlled by the second pull-down signal to be in a conduction state for setting the output port to the low voltage level provided at the first low-voltage port; and a fourth transistor having a gate connected to the pull-down signal input port, a source connected to the pull-up node, and a drain connected to the second low-voltage port, wherein the fourth transistor is controlled by the second pull-down signal to be in a conduction state for setting the pull-up node to the low voltage level provided at the second low-voltage port.

Optionally, each of the third and the fourth transistors is configured to be operated in a forward-bias state for no more than 50% of a scan operation cycle of the shift register unit thereof.

Optionally, the first discharge sub-unit comprises a fifth transistor having a gate connected to the pull-up node, a source connected to the pull-down node, and a drain connected to the second low-voltage port, wherein the fifth transistor is controlled by the potential level at the pull-up node to be in a conduction state for setting the pull-down node to a low voltage level provided at the second low-voltage port; a sixth transistor having a gate connected to the first input port, a source connected to the pull-down node, and a drain connected to the second low-voltage port, wherein the sixth transistor is controlled by the first input signal to be in a conduction state for setting the pull-down node to the low voltage level provided at the second low-voltage port; and a seventh transistor having a gate connected to the second input port, a source connected to the pull-down node, and a drain connected to the second low-voltage port, wherein the seventh transistor is controlled by the second input signal to be in a conduction state for setting the pull-down node to the low voltage level provided at the second low-voltage port.

Optionally, the second discharge sub-unit comprises an eighth transistor having a gate connected to the pull-up node, a source connected to the pull-down input port, and a drain connected to the first low-voltage port, wherein the eighth transistor is controlled by the potential level at the pull-up node to be in a conduction state for setting the pull-down input port to a low voltage level provided at the first low-voltage port.

Optionally, the pull-up drive sub-unit comprises a ninth transistor having a gate and a source commonly connected to the first input port and a drain connected to the pull-up node.

Optionally, the pull-down drive sub-unit comprises a tenth transistor having a gate and source commonly connected to the third input port, a drain connected to the pull-down node, wherein the tenth transistor is controlled by the third input signal to be in a conduction state for inputting the first pull-down signal to the pull-down node; and an eleventh transistor having a gate and source commonly connected to a fourth input port provided with a start signal for initializing the shift register unit, a drain connected to the pull-down node, wherein the eleventh transistor is controlled by the start signal to be in a conduction state for inputting the first pull-down signal to the pull-down node.

Optionally, the output sub-unit comprises a twelfth transistor having a gate connected to the pull-up node, a source connected to the second input port, and a drain connected to the output port, wherein the twelfth transistor is controlled by the potential level at the pull-up node to be in a conduction state for connecting the second input port to the output port; wherein the shift register unit further comprises a capacitor having a first terminal connected to the pull-up node and a second terminal connected to the output port.

Optionally, the shift register unit further comprises a first reset sub-unit and a second reset sub-unit, the first reset sub-unit being configured to receive a first reset signal from a first reset port for controlling resetting of potential levels at the pull-up node and the output port, and the second reset sub-unit being configured to receive a second reset signal from a second reset port for controlling resetting of potential level at the pull-up node.

Optionally, the first reset sub-unit comprises a thirteenth transistor having a gate connected to the first reset port to receive the first reset signal, a source connected to the pull-up node, and a drain connected to the second low-voltage port, wherein the thirteenth transistor is controlled by the first reset signal to be in a conduction state for connecting the pull-up node to the second low-voltage port; and a fourteenth transistor having a gate connected to the first reset port to receive the first reset signal, a source connected to the output port, and a drain connected to the first low-voltage port, wherein the fourteenth transistor is controlled by the first reset signal to be in a conduction state for connecting the output port to the first low-voltage port.

Optionally, the second reset sub-unit comprises a fifteenth transistor having a gate connected to the second reset port to receive the second reset signal, a source connected to the pull-up node, and a drain connected to the second low-voltage port, wherein the fifteenth transistor is controlled by the second reset signal to be in a conduction state for connecting the pull-up node to the second low-voltage port.

In another aspect, the present disclosure provides a display panel comprising a shift register circuit described herein.

In another aspect, the present disclosure provides a display apparatus comprising a display panel described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Conventional shift register circuits typically have a high noise-to-signal ratio. As it is formed by cascading a plurality of shift register units in series from one stage to next and a gate driving pulse signal outputted from a current-stage shift register unit will be used as an input signal to the next-stage shift register unit, if the noise level of the gate driving pulse signal at the current-stage unit is not effectively suppressed, the noise level will be amplified stage-by-stage and become larger especially when the shift register circuit is operated at a high temperature for a period of time. Sometime it may even cause multiple false outputs.

Figure 1:
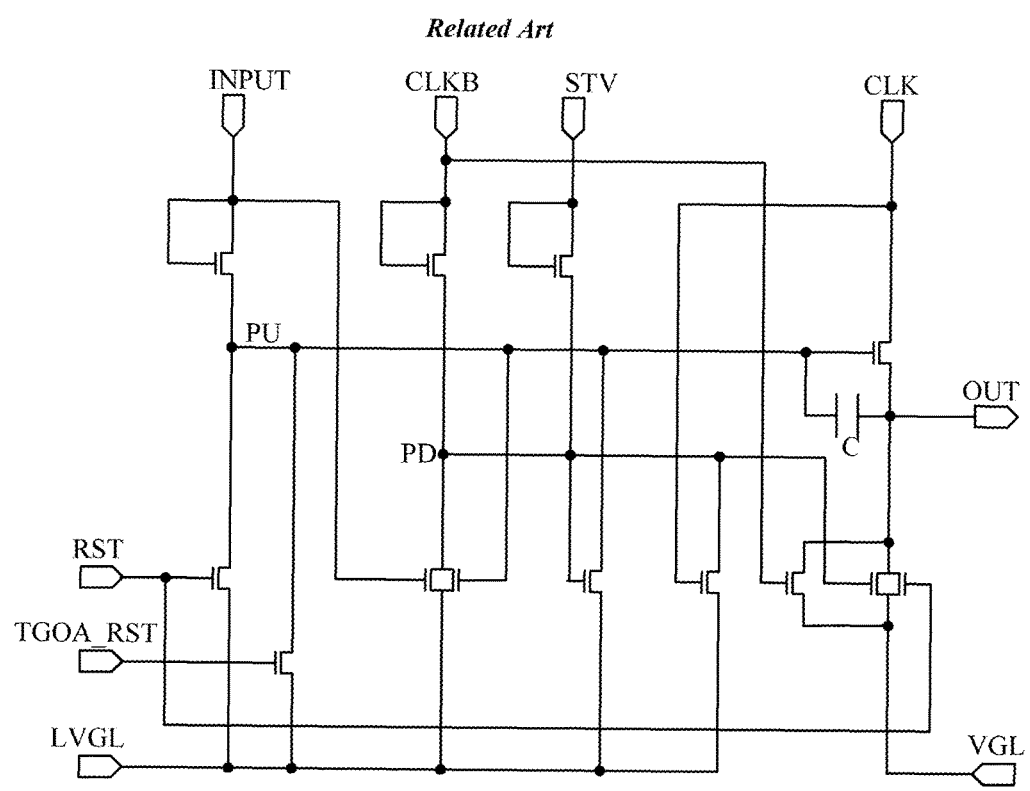
FIG. 1 is a circuit diagram of a conventional shift register unit.

FIG. 1 shows a conventional shift register unit used for cascading to an integrated shift register circuit, including at least a clock signal sub-unit, a pull-up (PU) node, a pull-down (PD) node, an output sub-unit, and a reset sub-unit. With the circuitry of shift register unit provided in FIG. 1, a signal at the pull-down node PD has a same phase as a clock signal CLKB at a third input port but has a phase inverted from another clock signal CLK at a second input port. During the operation of the shift register unit, the signal CLK is used to control discharging of the pull-down node PD. Only when the signal CLK is at low voltage level, the pull-down node PD is at high voltage level so that the noise levels at the output port OUT and the pull-up node PU can be reduced. Further, the signal CLK at high voltage level will pull down the pull-down node PD to low voltage level, at which the pull-down node PD is unable to reduce the noise levels at the output port OUT and the pull-up node PU. Therefore, within an operation cycle, the pull-down node PD only helps to reduce noise in a partial operation cycle when the signal CLK is at low voltage level but cannot help in the rest of operation cycle when the signal CLK is at high voltage level, i.e., is not effective to use the pull-down node PD to reduce noise when the signal CLK is at high voltage level in the conventional shift register unit.

Accordingly, the present disclosure provides a novel shift register circuit, and a display panel and a display apparatus having the same that substantially obviate one or more of the problems due to limitations and disadvantages of the related art. In one aspect, the present disclosure provides a shift register circuit having a plurality of shift register units, each of which is configured to provide a scan signal to a corresponding row of pixels of a display panel. In some embodiments, the shift register circuit includes a pull-down drive sub-unit providing a first pull-down signal to a pull-down node; a first pull-down sub-unit connected to the pull-down node, a pull-up node, and an output port, the first pull-down sub-unit being configured to reduce noise level at the pull-up node and/or the output port based on the first pull-down signal; and at least one second pull-down sub-unit. Each of the at least one second pull-down sub-unit has a pull-down input port. Each of the at least one second pull-down sub-unit is connected to the pull-up node and the output port, and is configured to reduce noise level at the pull-up node and/or output port based on the second pull-down signal inputted into the pull-down input port.

Figure 2:
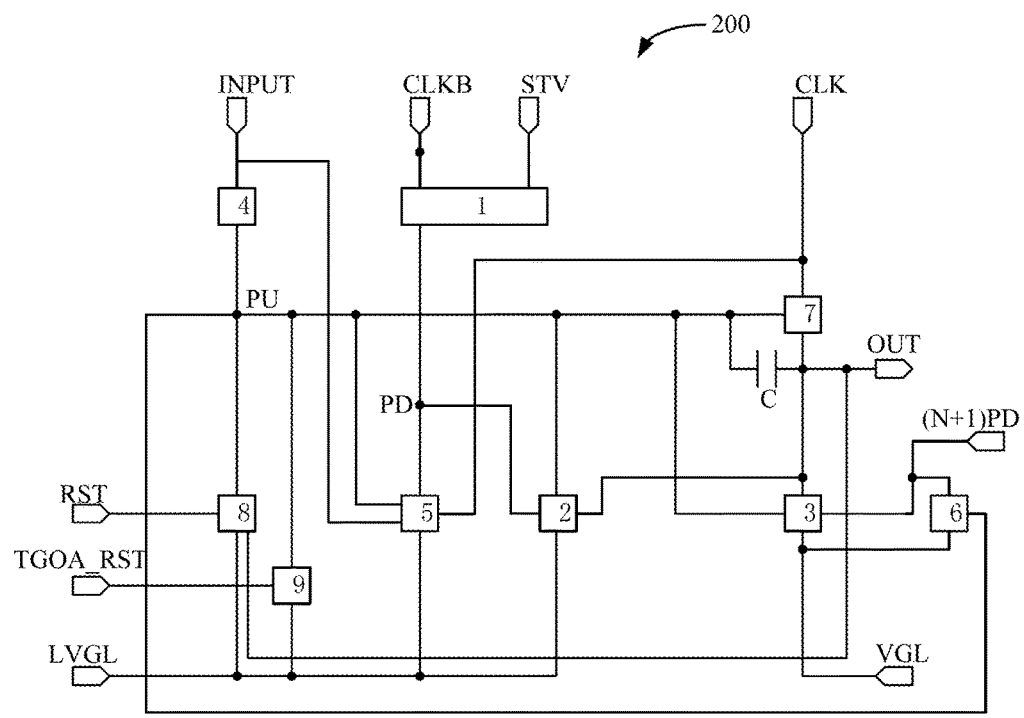
FIG. 2 is a schematic diagram of a shift register unit in some embodiments of the present disclosure.

FIG. 2 is a schematic diagram of a shift register unit in some embodiments. Shift register unit 200 is just one, a current-stage unit (for example, an Nth unit), of a plurality of shift register units that are cascaded one-by-one in multiple stages to form a shift register circuit. Each shift register unit is used to scan a corresponding row of pixels for controlling image display in a plurality of operation cycles. Referring to FIG. 2, the shift register unit 200 includes a pull-down drive sub-unit 1 configured to provide a first pull-down signal to a pull-down node PD. The shift register unit 200 also includes a first pull-down sub-unit 2 connected to the pull-down node PD, a pull-up node PU, and an output port OUT. The first pull-down sub-unit 2 is configured to reduce noise levels at the pull-up node PU and the output port OUT based on the first pull-down signal at the pull-down node PD.

Referring to FIG. 2, the shift register unit 200 further includes at least one (up to M, M is a natural integer greater than 1) second pull-down sub-unit 3 being correspondingly connected to at least one (up to M) pull-down input port (N+1)PD to respectively receive at least one (up to M) second pull-down signal. The at least one second pull-down sub-unit 3 is connected to the pull-up node PU, the output port OUT, and a first low-voltage port VGL (which provides a low voltage level for turning off certain control transistors in the shift register unit). The at least one second pull-down sub-unit 3 is used to reduce noise levels at the pull-up node PU and the output port OUT based on the at least one second pull-down signal. In particular, the first pull-down signal and the at least one second pull-down signal are configured such that a sum of a first duty cycle of the first pull-down signal and the second duty cycle of the second pull-down signal is substantially equal to 100%. The first pull-down signal and each up to M second pull-down signals are inverted in phase.

In some embodiments, the shift register unit 200 is able to provide the first pull-down signal through the pull-down drive sub-unit 1 and also provide at least one second pull-down signal through the at least one second pull-down sub-unit 3. Additionally, the first duty cycle of the first pull-down signal plus the second duty cycle of the second pull-down signal is 1 and the phase of the first pull-down signal is inverted to the phase of the second pull-down signal. As a result, even when the first pull-down signal is unable to provide a high voltage level (depending on circuit design for turning on certain control transistors in the shift register unit) for reducing noise levels at the pull-up node PU and the output port OUT, the at least one second pull-down signal is still able to provide a high voltage level for reducing noise levels at the pull-up node PU and the output port OUT. In other words, after the pull-up node PU finishes its pull-up function to become a low voltage level and the output port becomes a low voltage level too after outputting a gate driving signal and before a first input port INPUT of the shift register unit 200 receives a next high voltage level signal, the shift register unit 200 still is able to keep the noise level low at the output port OUT. Thus, noise reduction efficiency of the shift register unit 200 is substantially raised, compared to conventional shift register unit.

In some embodiments, the number of at least one second pull-down sub-unit 3 just is one and the number of the correspondingly pull-down input port (N+1)PD is just one. Of course, two or more second pull-down sub-units can be used and correspondingly two or more pull-down input ports can be used.

Referring to FIG. 2 again, the shift register 200 further includes a pull-up drive sub-unit 4 connected to the first input port INPUT and the pull-up node PU. The pull-up drive sub-unit 4 is configured to pull up a potential level at the pull-up node PU based on a first input signal inputted from the first input port INPUT. Additionally, the shift register unit 200 includes a first discharge sub-unit 5 connected to the first input port INPUT, a second input port CLK, the pull-up node PU, and the pull-down node PD. The first discharge sub-unit 5 is configured to control discharging of the pull-down node PD based on the first input signal from the first input port INPUT, a second input signal from the second input port CLK, and/or the potential level at the pull-up node PU. The first discharge sub-unit 5 also is connected to a second low-voltage port LVGL which is provided a low voltage level required by the shift register unit for turning off certain control transistors. The first pull-down sub-unit 2 is also connected to the second low-voltage port LVGL to receive a low voltage level for turning off one or more control transistors thereof.

Furthermore, the shift register unit 200 includes a second discharge sub-unit 6 connected to the pull-up node PU, the pull-down input port (N+1)PD, and the first low-voltage port VGL. The second discharge sub-unit 6 is configured to control discharging of the pull-down input port (N+1)PD based on the potential level at the pull-up node PU.

In some embodiments, when the pull-up node PU is at a high voltage level, or the first input port INPUT is at high voltage level, or the second input port CLK is at high voltage level, it is possible to make the first pull-down signal and the second pull-down signal at low voltage level. Therefore, during a time period when the pull-up node PU is performing its pull-up function and when the output port OUT is outputting a gate driving signal, the first pull-down sub-unit 2 controlled by the first pull-down signal at the pull-down node PD (via a transistor) is kept disconnection with the second pull-down sub-unit 3 controlled by the second pull-down signal at the pull-down input port (N+1)PD. As a result, normal pull-up function at the pull-up node PU and gate driving signal outputted at the output port OUT will not be disrupted by the additions of the at least one (up to M) second pull-down sub-unit 3 and associated pull-down input port (N+1)PD.

The shift register unit 200 also includes a capacitor C connected between the pull-up node PU and the output port OUT. In some embodiments, the time period that a high voltage level is provided at the pull-up node PU can be divided into two partial periods. A first partial period is associated with a high voltage level provided at the first input port INPUT. A second partial period is associated with a high voltage at the second input port CLK after the first input port INPUT is changed to a low voltage level. In the first partial period, the high voltage level at the pull-up node PU turns a first terminal of a capacitor C to a high voltage level. In the second partial period, the high voltage level at the second input port CLK makes a second terminal of the capacitor C to a high voltage level and makes the first terminal of the capacitor C to an even higher voltage level, which makes the potential level at the pull-up node PU at the even higher voltage level.

Referring again to the FIG. 2, the shift register unit 200 further includes an output sub-unit 7 connected to the pull-up node PU, the second input port CLK, and the output port OUT. The output sub-unit 7 is controlled by the potential level at the pull-up node PU for providing an output signal from the second input port CLK to the output port OUT.

Further referring to FIG. 2, the shift register unit 200 includes a third input port CLKB connected to the pull-down drive sub-unit 1. The third input port CLKB is able to provide the first pull-down signal to the pull-down node PD.

Referring to FIG. 2, the shift register unit 200 includes a first reset sub-unit 8 and a second reset sub-unit 9. The first reset sub-unit 8 is connected to a first rest port RST, the pull-up node PU, the output port OUT, and the second low-voltage port LVGL. The second reset sub-unit 9 is connected to a second reset port TGOA_RST, the pull-up node PU, and the second low-voltage port LVGL.

Figure 3:
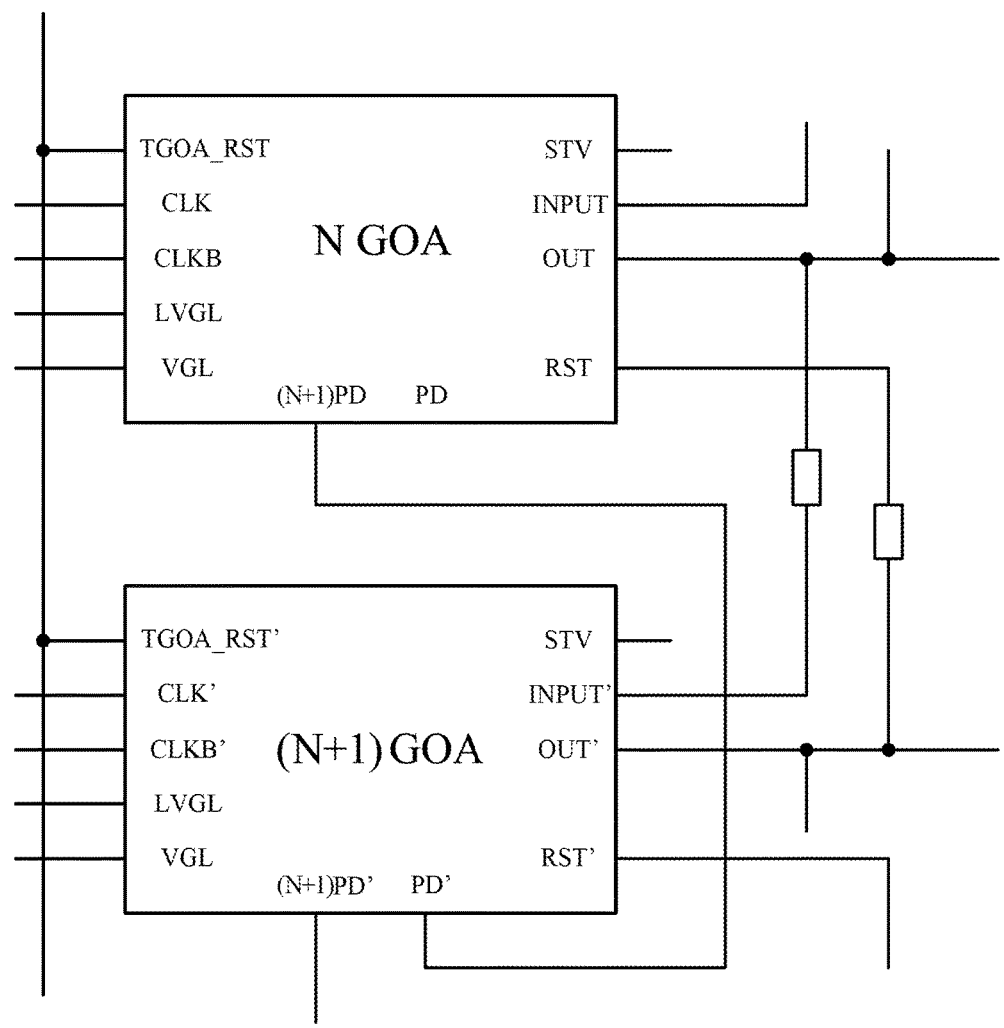
FIG. 3 is a simplified diagram of two cascaded shift register units in some embodiments of the present disclosure.

FIG. 3 is a simplified diagram of two cascaded shift register units in some embodiments. Referring to FIG. 3, this diagram can be expanded to a plurality of shift register units cascaded together in a similar manner to a multi-stage shift register circuit. As this multi-stage shift register circuit is directly integrated on an array substrate and each shift register unit is to output a gate driving signal to a common gate of a row of driving transistors associated with a row of pixels, it is also called a Gate-on-Array circuit. A current-stage shift register unit is also called NGOA and a next-stage shift register unit, which is adjacent to the current-stage shift register unit, is then called (N+1)GOA. Here N is an arbitrary natural integer. The output port OUT of the current-stage unit NGOA is also connected to the first input port INPUT' as an input signal of the next-stage unit (N+1)GOA.

The pull-down input port (N+1)PD of the current-stage unit NGOA is connected to the pull-down node PD' of the next-stage unit (N+1)GOA to receive an input signal.

In some embodiments, the shift register circuit, namely the GOA circuit, is configured to perform row-to-row scan over pixels of a display panel. Each shift register unit, which can be the same as the shift register unit 200, is represented by a current-stage NGOA to scan a corresponding (Nth) row of pixels. In particular, as an output signal of the output port OUT of the current-stage unit NGOA is used as an input signal to the first input port INPUT' of the next-stage unit (N+1)GOA, when the INPUT port is changed to low voltage level, the INPUT' port is turned to high voltage level. But when the INPUT port is changed to high voltage level, the third input port CLKB is also provided with a high voltage level signal. Therefore, the signal at the third input port CLKB of the current-stage unit NGOA is inverted in phase versus the third input port CLKB' of the next-stage unit (N+1)GOA. Additionally, the signal at the pull-down node PD of the current-stage unit NGOA is inverted in phase versus the signal at the pull-up node PD' of the next-stage unit (N+1)GOA. As a result, this ensures that the first pull-down signal outputted to the pull-down node PD and the second pull-down signal received at the pull-down input port (N+1)PD in each shift register unit are inverted in phase.

In some embodiments, the signal of the pull-down node PD' of a next-stage unit can be directly built into the current-stage unit without setting extra signal input port so the circuit layout can be simplified to save area. In some embodiments, input signal at the second input port CLK and input signal at the third input port CLKB are inverted in phase and have respective duty cycles of 50%.

Based on the embodiment of shift register unit and cascaded multi-stage GOA circuit, the first pull-down signal outputted to the pull-down node PD of the current-stage unit NGOA can be used to reduce or eliminate noise at the output port OUT in at least half duty cycle, while one second pull-down signal received from the next-stage unit (N+1) GOA can be used to reduce or eliminate noise at the output port OUT in the rest half duty cycle. This applies to a specific embodiment with the number M of the second pull-down sub-units being equal to 1.

In another specific embodiment with M=2, the input signal from the second input port CLK and the input signal from the third input port CLKB are inverted in phase while each input signal has a duty cycle of ⅓. In yet another specific embodiment, with M=3, the input signal from the second input port CLK and the input signal from the third input port CLKB are inverted in phase while each input signal has a duty cycle of ¼, and so on. In general, with M numbers of second pull-down sub-units being in use, the input signal from the second input port CLK and the input signal from the third input port CLKB are inverted in phase while each input signal has a duty cycle of 1/(M+1).

Figure 4:
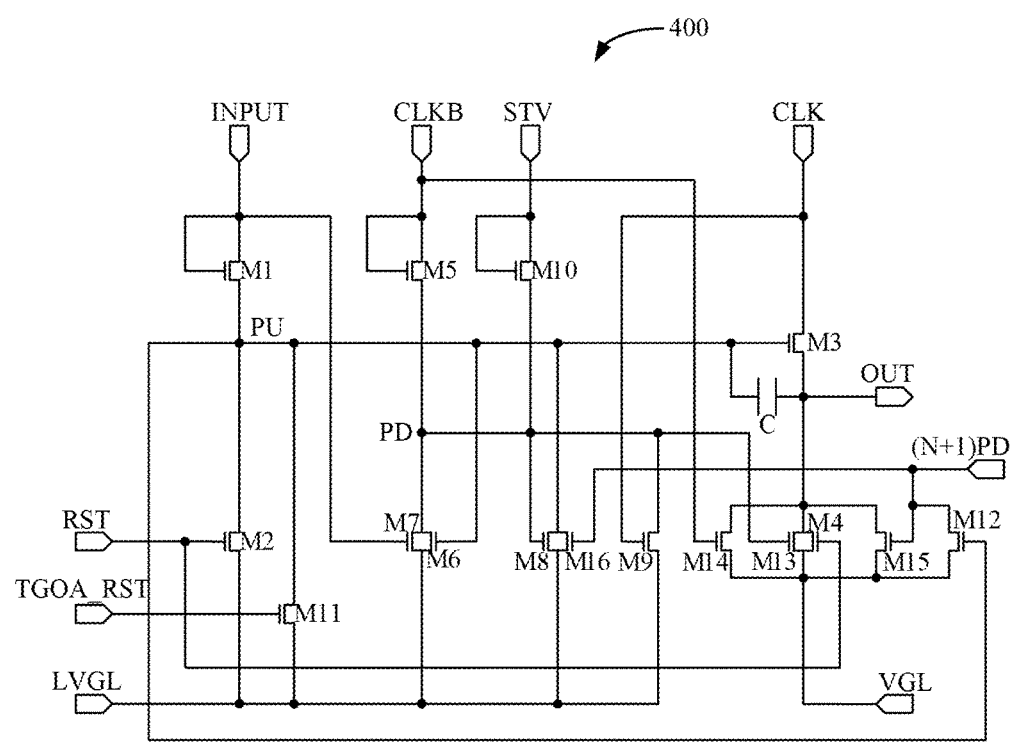
FIG. 4 is a circuit diagram of a shift register unit in some embodiments.

FIG. 4 is a circuit diagram of a shift register unit in some embodiments. A shift register unit 400 is substantially an example of the shift register unit 200 (shown in FIG. 2). Specifically, the first pull-down sub-unit 2 in the shift register unit 200 now is made by two transistors, a thirteenth transistor M13 and an eighth transistor M8 in the shift register unit 400. The thirteenth transistor M13 has a gate connected to a pull-down node PD, a source connected to an output port OUT, and a drain connected to a first low-voltage port VGL. M13 is configured to connect the output port OUT to the first low-voltage port VGL under a control of the first pull-down signal received at the pull-down node PD.

The eighth transistor M8 has a gate connected to the pull-down node PD, a source connected to a pull-up node PU, and a drain connected to a second low-voltage port LVGL. M8 is configured to connect the pull-up node to the second low-voltage port LVGL under a control of the first pull-down signal received at the pull-down node PD.

In the embodiment, the shift register unit 400 uses M13 to control noise reduction of the output port OUT. When the first pull-down signal at the pull-down node PD becomes high voltage level, M13 is turned on to connect the output port OUT to the first low-voltage port VGL so that the output port potential level is set to low voltage level for facilitating noise reduction at the output port. Additionally, M8 is also turned on by the high voltage level of the first pull-down signal so that the pull-up node PU is connected to the second low-voltage port LVGL and is kept at low voltage level for facilitating noise reduction at the pull-up node.

In some embodiments, the highest potential level at the pull-up node PU may be higher than the highest potential level at the output port, the potential level of the second low-voltage port LVGL may be optionally set to be lower than the potential level of the first low-voltage port VGL. This circuit setting allows the pull-up node PU to be discharged completely to ensure that the noise reduction at the pull-up node can be done successfully.

In some embodiments, transistors M8 and M13 are set to operate within a forward-bias stress cycle time that is equal to or less than 50% of scan time of the shift register circuit. The forward-bias stress cycle time corresponds to a time period in an operation cycle with a positive voltage being applied to the gate of the transistor. By setting relatively short forward-bias stress cycle time for the transistors in the first pull-down sub-unit, working hours of both transistors M8 and M13 are reduced with corresponding transistor lifespan and overall reliability of the shift register circuit being enhanced.

Referring to FIG. 4 (and FIG. 2), the second pull-down sub-unit 3 of the shift register unit 200 now is made by a fifteenth transistor M15 and a sixteenth transistor M16 in the shift register unit 400. M15 has a gate connected to a pull-down input port (N+1)PD, a source connected to the output port OUT, and a drain connected to the first low-voltage port VGL. M15 is used to connect the output port OUT to the first low-voltage port VGL under a control of the second pull-down signal received from the pull-down input port (N+1)PD. M16 has a gate connected to the pull-down input port (N+1)PD, a source connected to the pull-up node PU, and a drain connected to the second low-voltage port LVGL. M16 is used to connect the pull-up node PU to the second low-voltage port LVGL under a control of the second pull-down signal received from the pull-down input port (N+1)PD.

In some embodiments, the shift register unit 400 uses M15 to control noise reduction at the output port OUT. When the second pull-down signal at the pull-down input port (N+1)PD is set to high voltage level, M15 is turned on to connect the output port OUT to the first low-voltage port VGL so that the output port OUT is kept at the low voltage level for facilitating noise reduction thereof. Additionally, the shift register unit 400 also uses M16 to control noise reduction at the pull-up node PU. When the second pull-down signal is set to high voltage level, the pull-up node PU is connected to the second low-voltage port LVGL as M16 is in a conduction state. The pull-up node PU thus is set to low voltage level to perform noise reduction thereof.

In some embodiments, transistors M15 and M16 are set to operate within a forward-bias stress cycle time that is equal to or less than 50% of scan time of the shift register circuit. By setting relatively short forward-bias stress cycle time for the transistors in the second pull-down sub-unit, working hours of both transistors M15 and M16 are reduced with transistor lifespan and overall reliability of the shift register circuit being enhanced.

Referring to FIG. 4 (and FIG. 2), the first discharge sub-unit 5 of the shift register unit 200 now is made by a sixth transistor M6, a seventh transistor M7, and a ninth transistor M9 in the shift register unit 400. M6 has a gate connected to the pull-up node PU, a source connected to the pull-down node PD, and a drain connected to the second low-voltage port LVGL. M6 is controlled by the potential level at the pull-up node PU to be in a conduction state for connecting the pull-down node PD to the second low-voltage port LVGL. M7 has a gate connected to a first input port INPUT, a source connected to the pull-down node PD, and a drain connected to the second low-voltage port LVGL. M7 is controlled by the first input signal received from the first input port INPUT to be in a conduction state for connecting the pull-down node PD to the second low-voltage port LVGL. M9 has a gate connected to a second input port CLK, a source connected to the pull-down node PD, and a drain connected to the second low-voltage port LVGL. M9 is controlled by the second input signal received from the second input port CLK to be in a conduction state for connecting the pull-down node PD to the second low-voltage port LVGL.

In some embodiments, during operation of the shift register unit 400 when the pull-up node PU is set to high voltage level, M6 is turned on to connect the pull-down node PD to the second low-voltage port LVGL. Thus, the pull-down node PD is discharged to the second low-voltage port LVGL and is kept at a low voltage level without inducing any pulling up effect towards the pull-up node PU.

In some embodiments, when the first input signal from the first input port INPUT and the second input signal from the second input port CLK are set to high voltage level, the pull-down node PD is connected to the second low-voltage port LVGL to discharge the pull-down node PD. The pull-down node PD is thus kept at the low voltage level without affecting normal signal output function of the output port OUT.

Referring to FIG. 4 (and FIG. 2), the second discharge sub-unit 6 of the shift register unit 200 now is made by a twelfth transistor M12 in the shift register unit 400. M12 has a gate connected to the pull-up node PU, a source connected to the pull-down input port (N+1)PD, and a drain connected to the first low-voltage port VGL. M12 is used to connect the pull-down input port (N+1)PD to the first low-voltage port VGL under a control of the potential level at the pull-up node PU.

In some embodiments, when the pull-up node PU is set to high voltage level to turn on M12, the pull-down input port (N+1)PD is connected to the first low-voltage port VGL. The second pull-down signal received from the pull-down port (N+1)PD is set to low voltage level. Thus, transistors M15 and M16 are turned off to avoid any impact on pull-up function at the pull-up node PU and normal signal outputting function at the output port OUT.

Referring to FIG. 4 (and FIG. 2) again, the pull-up drive sub-unit 4 in the shift register unit 200 now is made by a first transistor M1 in the shift register unit 400. M1 has a gate and a source commonly connected to the first input port INPUT and a drain connected to the pull-up node PU. M1 is configured to be in a conduction state when the first input port INPUT sends a high voltage level signal so that this high voltage level is passed to the pull-up node PU.

Referring to FIG. 4 (and FIG. 2) again, the pull-down drive sub-unit 1 in the shift register unit 200 now is made by a fifth transistor M5 and a tenth transistor M10 in the shift register unit 400. M5 has a gate and a source commonly connected to a third input port CLKB and a drain connected to the pull-down node PD. M5 is configured to pass a first pull-down signal to the pull-down node PD based on a third input signal provided at the third input port CLKB. M10 has a gate and a source commonly connected to a fourth input port STV and a drain connected to the pull-down node PD. M10 is configured to pass a first pull-down signal to the pull-down node PD based on the fourth input signal received from the fourth input port STV.

In some embodiments, when the third input port CLKB provides a high voltage level, M5 is in a conduction state so that the high voltage level at the third input port CLKB is passed to the pull-down node PD. When the fourth input port STV provides a high voltage level, M10 is in a conduction state so that the high voltage level at the fourth input port STV is passed to the pull-down node PD.

Referring to FIG. 4 (and FIG. 2) again, the output sub-unit 7 of the shift register unit 200 now is made by a third transistor M3 having a gate connected to the pull-up node PU, a source connected to the second input port CLK, and a drain connected to the output port OUT. M3 is controlled by the potential level at the pull-up node PU to be in a conduction state for connecting the second input port CLK to the output port OUT.

Referring to FIG. 4, the shift register unit 400 further includes a capacitor C having a first terminal connected to the pull-up node PU and a second terminal connected to the output port OUT. The third transistor M3 is turned on when the pull-up node PU is set to high voltage level so that the second input signal provided at the second input port CLK is outputted at the output port OUT as a gate driving signal. The capacitor C, once it is charged as the pull-up node PU is set to high voltage level, its first terminal will be at high voltage level and is higher than its second terminal as the second input port CLK is at low voltage level. When the second input port CLK becomes a high voltage level, the second terminal of the capacitor is at the high voltage level too, which pushes the first terminal to an even higher potential level due to the capacitance. This enhances source-to-drain conduction of the transistor M3 for fulfilling its function in the output sub-unit.

Referring to FIG. 4 (and FIG. 2), the first reset sub-unit 8 of the shift register unit 200 now is made by a second transistor M2 and a fourth transistor M4 in the shift register unit 400 for resetting potential levels at the pull-up node PU and the output port OUT. The second reset sub-unit 9 of the shift register unit 200 now is made by an eleventh transistor M11 in the shift register unit 400 for resetting potential level at the pull-up node PU.

In particular, M2 has a gate connected to a first reset port RST, a source connected to the pull-up node PU, and a drain connected to the second low-voltage port LVGL. M2 is used to connect the pull-up node PU to the second low-voltage port LVGL under a control of a first reset signal provided at the first reset port RST. M4 has a gate connected to the first reset port RST, a source connected to the output port OUT, and a drain connected to the first low-voltage port VGL. M4 is used to connect the output port OUT to the first low-voltage port VGL under the control of the first reset signal provided at the first reset port RST. M11 has a gate connected to a second reset port TGOA_RST, a source connected to the pull-up node PU, and a drain connected to the second low-voltage port LVGL. M11 is used to connect the pull-up node PU to the second low-voltage port LVGL under a control of a second reset signal provided to the second reset port TGOA_RST.

In some embodiments, when the first reset signal is a high voltage level, M2 and M4 are turned on to set the pull-up node PU and the output port OUT to high voltage level. When the second reset signal is a high voltage level, M11 is turned on to set the pull-up node PU to high voltage level. In some embodiments, the first reset signal is applied via the first reset port RST to reset potential levels of the pull-up node PU and the output port OUT of a current-stage shift register unit. Referring to FIG. 3, the second reset port TGOA_RST of the current-stage unit NGOA and the second reset port TGOA_RST' of the next-stage unit (N+1)GOA are commonly connected to a same signal line. Through this common signal line, every shift register unit within the shift register circuit can be applied with a second reset signal to reset potential level of each corresponding pull-up node PU.

In some embodiments, the shift register unit 400 also includes another transistor M14 having a gate connected to the third input port CLKB, a source connected to the first low-voltage port VGL, and a drain connected to the output port OUT. When the third input signal from CLKB is at high voltage level, M14 is turned on to set or keep the output port OUT at low voltage level unless the pull-up node PU is performing its pull-up function to drive the output port OUT to high voltage level during a normal outputting period.

In the examples of the present disclosure, all transistors shown in the shift register unit are n-type transistors, serving an example for illustrating the operation of the shift register unit and its featured function for noise reduction at the pull-up node and the output port in a whole operation cycle.

Figure 5:
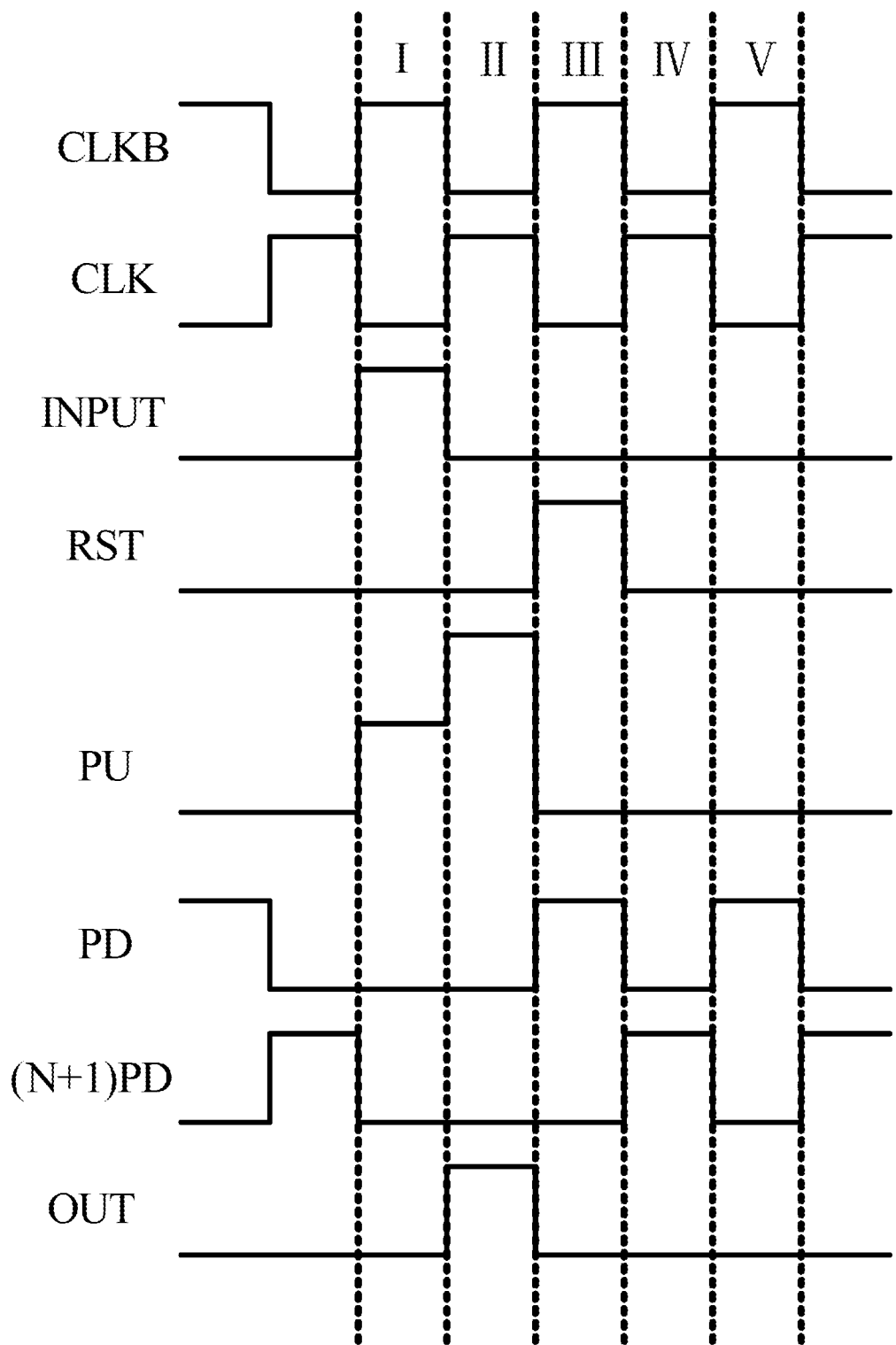
FIG. 5 is a timing diagram of an operation cycle with several working phases for the shift register unit of FIG. 4 of the present disclosure.

FIG. 5 is a timing diagram of an operation cycle with several working phases for the shift register unit. Referring to FIG. 5, an operation cycle including a plurality sequential phases of applying multiple control signals for driving the shift register unit of FIG. 4. Each operation cycle includes, sequentially, first phase I, a second phase II, a third phase III, a fourth phase IV, and a fifth phase V.

Referring both FIG. 4 and FIG. 5, in the first phase I, INPUT is set to a high voltage level to turn M and M7 on, pulling up the potential level at the pull-up node PU and pulling down the potential level at the pull-down node PD. The second input port CLK is set to low voltage level to turn M9 off while the third input port CLKB is set to high voltage level to turn M14 on so that the output port OUT is set to low voltage level passed from the first low-voltage port VGL. M3 is turned on to allow the low voltage signal from CLK passing to the output port OUT. M12 is turned on by high voltage level of PU to set (N+1)PD port at low voltage level VGL.

In the second phase II, INPUT is set to low voltage level while CLK and CLKB reverse phases with high voltage level at CLK and low voltage level at CLKB. M9 is turned on to keep PD at low voltage level. The capacitor C, which is charged in phase I, now is able to push the PU potential even higher. M3 remains at on state by the high voltage level at PU, which performs a pull-up function to allow high voltage signal passed from the second input port CLK to the output port OUT (for outputting a gate driving signal). M12 remains on by high voltage level of PU to keep (N+1)PD port at low voltage level VGL.

In the third phase III, INPUT is again set to low voltage level. Reset port RST provides a high voltage level signal to turn on M2 and M4 to respectively reset PU and OUT to low voltage level, i.e., PU finishes its pull-up function and OUT finishes its function for outputting the gate driving signal in this phase. However, CLK and CLKB reverse phases again in this phase to make the CLK at low voltage level and CLKB at high voltage level. Thus, M5 is turned on to pull up potential level at PD to high voltage level which is able to provide noise reduction for the node PU and OUT. As the signal at PD of the current-stage unit NGOA is inverted in phase versus the signal at PD' of the next-stage unit (N+1) GOA, the (N+1)PD port of NGOA remains at low voltage level.

In the fourth phase IV, CLK and CLKB reverse phases again in this phase to make the CLK at high voltage level and CLKB at low voltage level. The PD potential is pulled down while PU potential is kept at low voltage level and also OUT is kept at low voltage level. (N+1)PD port receives a high voltage level inverted from low voltage level PD' of next-stage (N+1)NGOA and is able to provide noise reduction for PU and OUT even though node PD now is at low voltage level.

In the fifth phase V, CLK and CLKB reverse phases again in this phase to make the CLK at low voltage level and CLKB at high voltage level. M5 is turned on to make PD being pulled up to high voltage level, turning M8 on to keep PU at low voltage level and turning on M13 to keep OUT at low voltage level. (N+1)PD port receives a low voltage level inverted from high voltage level PD' of next-stage (N+1) NGOA. However, PD is at high level to maintain its role for helping noise reduction on node PU and OUT.

Referring to FIG. 5, unlike the convention shift register unit can only use pull-down node PD to achieve noise reduction function at the output port OUT when CLK signal is at low voltage level during a partial cycle time, the shift register unit according to some embodiments of the present disclosure is able to keep performing noise reduction function at both the pull-up node and the output port substantially in a whole cycle time after the pull-up node has pull-up potential and output signal has been outputted from the output port OUT but before the INPUT port receives next high voltage level signal. Therefore, the noise reduction efficiency associated with the shift register unit of the present disclosure is much improved.

Figure 6A:
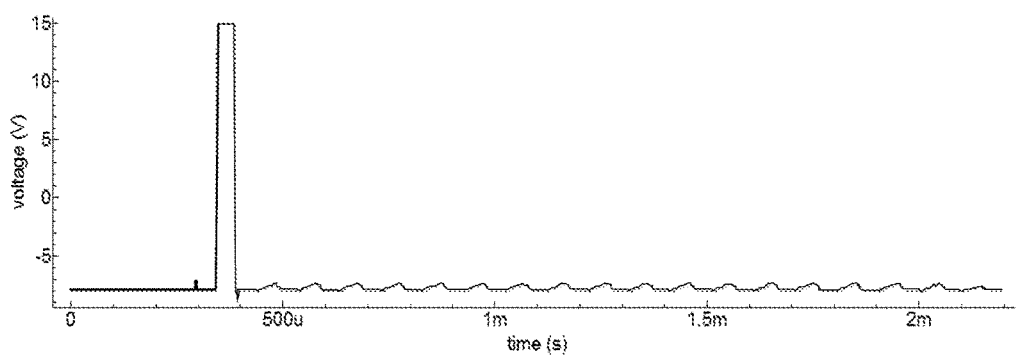
FIG. 6A is a diagram illustrating an output signal and noise level of a conventional shift register unit.
Figure 6B:
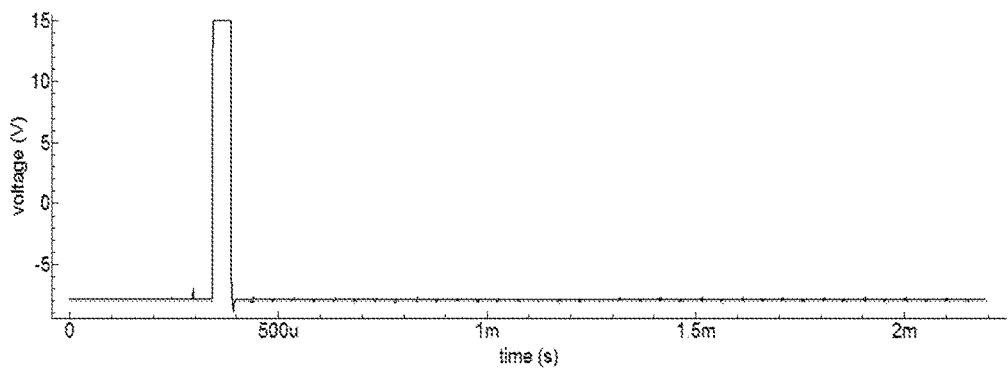
FIG. 6B is a diagram illustrating an output signal and noise level of a shift register unit in some embodiments.

FIG. 6A is a diagram illustrating an output signal and noise level of a conventional shift register unit. FIG. 6B is a diagram illustrating an output signal and noise level of a shift register unit in some embodiments. For both diagrams, horizontal axis represents time and vertical axis represents voltage (signal). By comparing the results of both figures, the output signal in FIG. 6B has much less noise level than the output signal in FIG. 6A. In other words, the noise level in the output signal at the output port OUT of the shift register unit according to some embodiments of the present disclosure is substantially smaller than that of conventional shift register unit.

Figure 7A:
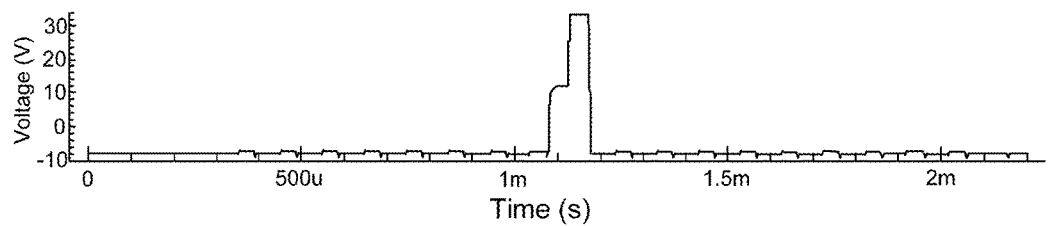
FIG. 7A is a diagram illustrating a pull-up node potential level of a conventional shift register unit.
Figure 7B:
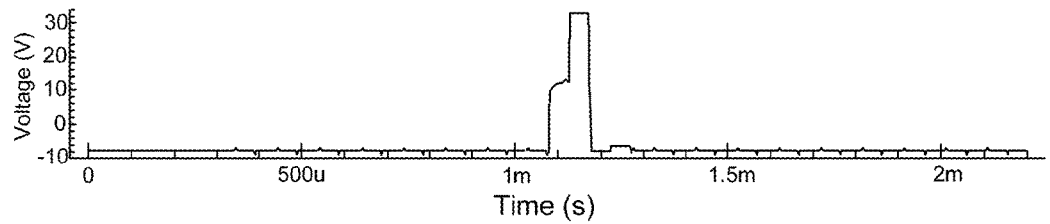
FIG. 7B is a diagram illustrating a pull-up node potential level of a shift register unit in some embodiments.

FIG. 7A is a diagram illustrating a pull-up node potential level of a conventional shift register unit. FIG. 7B is a diagram illustrating a pull-up node potential level of a shift register unit in some embodiments. For both diagrams, horizontal axis represents time and vertical axis represents voltage (signal). By comparing the results of both figures, the pull-up node potential in FIG. 7B has much less noise level than that in FIG. 7A. In other words, the noise level of pull-up node potential at the PU node of the shift register unit according to some embodiments of the present disclosure is substantially smaller than that of conventional shift register unit.

Figure 8:
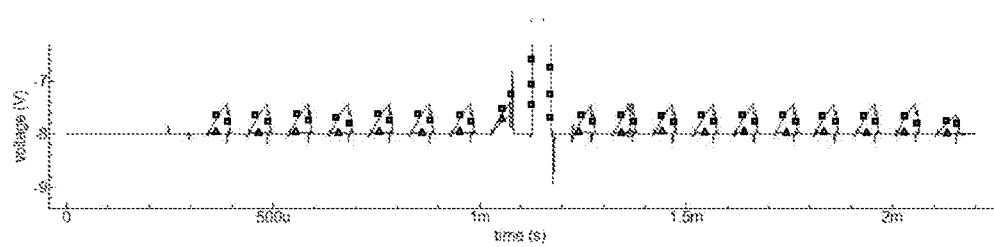
FIG. 8 is a diagram illustrating a comparison of noise levels in an output signal of a conventional shift register unit versus a shift register unit in some embodiments.

FIG. 8 is a diagram illustrating a comparison of noise levels in an output signal of a conventional shift register unit versus a shift register unit in some embodiments. In FIG. 8, the curve based on data depicted by squares is transient noise of output signals resulted from the conventional shift register unit and the curve based on data depicted by triangles is transient noise of output signals resulted from the shift register unit in some embodiments. Horizontal axis represents time and vertical axis represents voltage (signal). Direct comparison of two transient noise data curves clearly indicates that the noise level in the output signal of the shift register unit according to some embodiments of the present disclosure is substantially smaller than that of conventional shift register unit.

Figure 9:
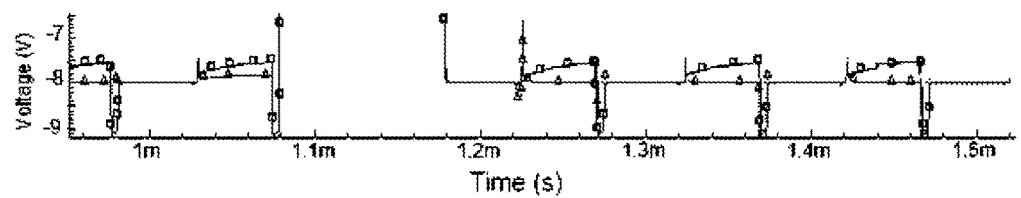
FIG. 9 is a diagram illustrating a comparison of noise levels at a pull-up node of a conventional shift register unit versus a shift register unit in some embodiments.

FIG. 9 is a diagram illustrating a comparison of noise levels at an pull-up node of a conventional shift register unit versus a shift register unit in some embodiments. In FIG. 9, the curve based on data depicted by squares is transient noise of pull-up node potential obtained from the conventional shift register unit and the curve based on data depicted by triangles is transient noise of pull-up node potential obtained from the shift register unit in some embodiments. Horizontal axis represents time and vertical axis represents voltage (signal). Direct comparison of two transient noise data curves clearly indicates that the noise level at the pull-up node of the shift register unit according to some embodiments of the present disclosure is substantially smaller than that of conventional shift register unit.

In another aspect, the present disclosure provides a display panel having the shift register circuit described herein. For example, the display panel may include the shift register circuit cascaded, according to the manner described in FIG. 3, by a plurality of shift register units. Optionally, each shift register unit is substantially configured as the one shown in FIG. 2 or FIG. 4.

In another aspect, the present disclosure provides a display apparatus having a display panel described herein. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A shift register circuit comprising a plurality of shift register units, each shift register unit being configured to provide a scan signal to a corresponding row of pixels of a display panel, the shift register unit comprises: a pull-down drive sub-unit providing a first pull-down signal to a pull-down node; a first pull-down sub-unit connected to the pull-down node, a pull-up node, and an output port, the first pull-down sub-unit being configured to reduce noise level at the pull-up node and/or the output port based on the first pull-down signal; and at least one second pull-down sub-unit, each of the at least one second pull-down sub-unit having a pull-down input port, each of the at least one second pull-down sub-unit connected to the pull-up node and the output port, and being configured to reduce noise level at the pull-up node and/or output port based on the second pull-down signal inputted into the pull-down input port; wherein a sum of a first duty cycle of the first pull-down signal and a second duty cycle of the second pull-down signal is substantially 100%, the first pull-down signal and the second pull-down signal are inverted in phase; wherein the shift register unit further comprises: a pull-up drive sub-unit connected to a first input port and the pull-up node, and configured to pull up a potential level at the pull-up node based on a first input signal from the first input port; a first discharge sub-unit connected to the first input port, a second input port, the pull-up node, and the pull-down node, and configured to control discharging of the pull-down node based on the first input signal, a second input signal from the second input port, and/or the potential level at the pull-up node; and a second discharge sub-unit connected to the pull-up node and the pull-down input port, and configured to control discharging of the pull-down input port based on the potential level at the pull-up node.

2. The shift register circuit of claim 1, wherein the shift register unit further comprises an output sub-unit connected to the pull-up node, the second input port, and the output port, and configured to control passing of a signal from the second input port to the output port.

3. The shift register circuit of claim 2, wherein the shift register unit further comprises a third input port connected to the pull-down drive sub-unit, and configured to output a first pull-down signal to the pull-down node controlled by the pull-down drive sub-unit; wherein the plurality of shift register units are cascaded in multiple stages so that the output port of a current-stage unit is connected to the first input port of a next-stage unit, the pull-down input port of the current-stage unit is connected to the pull-down node of the next-stage unit.

4. The shift register circuit of claim 3, wherein a third input signal inputted to the third input port and the second input signal inputted to the second input port are inverted in phase, each of the third input signal and the second input signal having a duty cycle of approximately 50%.

5. The shift register circuit of claim 3, wherein the first pull-down sub-unit comprises:

a first transistor having a gate connected to the pull-down node, a source connected to the output port, and a drain connected to a first low-voltage port provided with a low voltage level, wherein the first transistor is controlled by the first pull-down signal to be in a conduction state for setting the output port to a low voltage level provided at the first low-voltage port; and a second transistor having a gate connected to the pull-down node, a source connected to the pull-up node, and a drain connected to a second low-voltage port provided with a low voltage level, wherein the second transistor is controlled by the first pull-down signal to be in a conduction state for setting the pull-up node to a low voltage level provided at the second low-voltage port.

6. The shift register circuit of claim 5, wherein each of the first and the second transistors is configured to be operated in a forward-bias state for no more than 50% of a scan operation cycle of the shift register unit thereof.

7. The shift register circuit of claim 5, wherein the second pull-down sub-unit comprises:

a third transistor having a gate connected to the pull-down signal input port, a source connected to the output port, and a drain connected to the first low-voltage port, wherein the third transistor is controlled by the second pull-down signal to be in a conduction state for setting the output port to the low voltage level provided at the first low-voltage port; and a fourth transistor having a gate connected to the pull-down signal input port, a source connected to the pull-up node, and a drain connected to the second low-voltage port, wherein the fourth transistor is controlled by the second pull-down signal to be in a conduction state for setting the pull-up node to the low voltage level provided at the second low-voltage port.

8. The shift register circuit of claim 7, wherein each of the third and the fourth transistors is configured to be operated in a forward-bias state for no more than 50% of a scan operation cycle of the shift register unit thereof.

9. The shift register circuit of claim 5, wherein the first discharge sub-unit comprises:

a fifth transistor having a gate connected to the pull-up node, a source connected to the pull-down node, and a drain connected to the second low-voltage port, wherein the fifth transistor is controlled by the potential level at the pull-up node to be in a conduction state for setting the pull-down node to a low voltage level provided at the second low-voltage port;

a sixth transistor having a gate connected to the first input port, a source connected to the pull-down node, and a drain connected to the second low-voltage port, wherein the sixth transistor is controlled by the first input signal to be in a conduction state for setting the pull-down node to the low voltage level provided at the second low-voltage port; and a seventh transistor having a gate connected to the second input port, a source connected to the pull-down node, and a drain connected to the second low-voltage port, wherein the seventh transistor is controlled by the second input signal to be in a conduction state for setting the pull-down node to the low voltage level provided at the second low-voltage port.

10. The shift register circuit of claim 5, wherein the second discharge sub-unit comprises an eighth transistor having a gate connected to the pull-up node, a source connected to the pull-down input port, and a drain connected to the first low-voltage port, wherein the eighth transistor is controlled by the potential level at the pull-up node to be in a conduction state for setting the pull-down input port to a low voltage level provided at the first low-voltage port.

11. The shift register circuit of claim 5, wherein the pull-up drive sub-unit comprises a ninth transistor having a gate and a source commonly connected to the first input port and a drain connected to the pull-up node.

12. The shift register circuit of claim 5, wherein the pull-down drive sub-unit comprises:
  a tenth transistor having a gate and source commonly connected to the third input port, a drain connected to the pull-down node, wherein the tenth transistor is controlled by the third input signal to be in a conduction state for inputting the first pull-down signal to the pull-down node; and
  an eleventh transistor having a gate and source commonly connected to a fourth input port provided with a start signal for initializing the shift register unit, a drain connected to the pull-down node, wherein the eleventh transistor is controlled by the start signal to be in a conduction state for inputting the first pull-down signal to the pull-down node.

13. The shift register circuit of claim 5, wherein the output sub-unit comprises:
  a twelfth transistor having a gate connected to the pull-up node, a source connected to the second input port, and a drain connected to the output port, wherein the twelfth transistor is controlled by the potential level at the pull-up node to be in a conduction state for connecting the second input port to the output port;
  wherein the shift register unit further comprises a capacitor having a first terminal connected to the pull-up node and a second terminal connected to the output port.

14. The shift register circuit of claim 5, wherein the shift register unit further comprises a first reset sub-unit and a second reset sub-unit, the first reset sub-unit being configured to receive a first reset signal from a first reset port for controlling resetting of potential levels at the pull-up node and the output port, and the second reset sub-unit being configured to receive a second reset signal from a second reset port for controlling resetting of potential level at the pull-up node.

15. The shift register circuit of claim 14, wherein the first reset sub-unit comprises:
  a thirteenth transistor having a gate connected to the first reset port to receive the first reset signal, a source connected to the pull-up node, and a drain connected to the second low-voltage port, wherein the thirteenth transistor is controlled by the first reset signal to be in a conduction state for connecting the pull-up node to the second low-voltage port; and
  a fourteenth transistor having a gate connected to the first reset port to receive the first reset signal, a source connected to the output port, and a drain connected to the first low-voltage port, wherein the fourteenth transistor is controlled by the first reset signal to be in a conduction state for connecting the output port to the first low-voltage port.

16. The shift register circuit of claim 14, wherein the second reset sub-unit comprises a fifteenth transistor having a gate connected to the second reset port to receive the second reset signal, a source connected to the pull-up node, and a drain connected to the second low-voltage port, wherein the fifteenth transistor is controlled by the second reset signal to be in a conduction state for connecting the pull-up node to the second low-voltage port.

17. A display panel comprising a shift register circuit of claim 1.

18. A display apparatus comprising a display panel of claim 17.

* * * * *